United States Patent
Noji et al.

[11] Patent Number: 5,883,780
[45] Date of Patent: Mar. 16, 1999

[54] CERAMIC ELECTRONIC PART

[75] Inventors: Takashi Noji, Takefu; Mamoru Ogawa, Fukui-ken, both of Japan

[73] Assignee: Murata Manufacturing Co., Ltd., Japan

[21] Appl. No.: 888,368

[22] Filed: Jul. 3, 1997

[30] Foreign Application Priority Data

Jul. 4, 1996 [JP] Japan ................................ 8-195545

[51] Int. Cl.$^6$ ............................ H01G 4/005; H01G 2/20; H01G 4/008
[52] U.S. Cl. ..................... 361/303; 361/305; 361/309; 361/308.1; 361/321.5
[58] Field of Search .................................. 361/303–305, 361/306.1, 306.2–306.3, 308.1, 308.2, 309–313, 321.1, 321.2, 321.3, 321.4, 321.5; 29/25.42

[56] References Cited

U.S. PATENT DOCUMENTS

| | | | |
|---|---|---|---|
| 4,771,520 | 9/1988 | Tanaka et al. | 29/25.42 |
| 4,811,162 | 3/1989 | Maher et al. | 361/308 |
| 4,819,128 | 4/1989 | Florian et al. | 361/321 |
| 5,245,309 | 9/1993 | Kawase et al. | 338/22 |
| 5,335,139 | 8/1994 | Nomura et al. | 361/4 |

FOREIGN PATENT DOCUMENTS 6163311   6/1994   Japan .

*Primary Examiner*—Hyung-Sub Sough
*Assistant Examiner*—Anthony Dinkins
*Attorney, Agent, or Firm*—Ostrolenk, Faber, Gerb & Soffen, LLP

[57] ABSTRACT

A highly reliable ceramic electronic part that can be reliably attracted by a vacuum attraction type nozzle without inviting cracks or breaks. The ceramic electronic part comprises a ceramic body and external electrodes attached around the end surfaces of the ceramic body. The ceramic body has a length $(L) \leq 1.0$ mm, a height $(H) \leq 0.5$ mm, and a width $\leq 0.5$ mm. The external electrodes have rounded portions extending from the end surfaces of the ceramic body to their adjacent outer surfaces of the ceramic body. The thickness t of these rounded portions is set so that $t \leq 10 \mu m$ and $t \leq H/30$. The thickness t of these rounded portions may further be set so that $t \leq W/30$.

2 Claims, 4 Drawing Sheets

CERAMIC ELECTRONIC PART

BACKGROUND OF THE INVENTION

1. Field of the Invention

The present invention relates to a ceramic electronic part and, more particularly, to a small-sized, surface-mounted ceramic electronic part equipped with external electrodes around its both of its end surfaces.

2. Description of the Related Art

Known surface-mounted ceramic electronic parts include laminated ceramic capacitors and ceramic piezoelectric parts. One such ceramic electronic part is shown in FIGS. 5 and 6, where the part is indicated by 25. This part comprises a boxlike ceramic device or body 21 having end surfaces 22 and side surfaces 23. External electrodes 24 are attached around both end surfaces and have rounded portions extending from the end surfaces 22 to the side surfaces 23. When ceramic electronic parts of this kind are made in smaller sizes, the ceramic device 21 is required to be made with quite small dimensions, e.g., the length (L) being less than 1.0 mm, and the height (H) and width (W) being less than 0.5 mm.

The above-described small-sized ceramic electronic part has the problem that attraction by the attracting nozzle of an automatic packaging machine used during a packaging step has low reliability. In particular, the automatic packaging machine detects the position or the like of each ceramic electronic part by a so-called reflection type image recognition method. As shown in FIG. 7, this machine utilizes a vacuum attraction type attracting nozzle A having a wide front end portion to attract the ceramic electronic part 25. Each external electrode 24 has rounded portions 24a extending from one end surface 22 of a ceramic device 21 to its adjacent side surfaces. These rounded portions 24a have a large thickness t (FIG. 6). The bottom surface $A_1$ of the attracting nozzle A makes contact with the top surface 23a of the ceramic device 21. On this attracted surface 23a, a large step is created between the portions where the external electrode 24 is formed and not formed, respectively. Also, the ceramic device 21 has a small flat surface area. Therefore, it is impossible to secure a large attracted area. In consequence, the attraction by vacuum attraction has low reliability.

As shown in FIG. 8, an automatic packaging machine can detect the position or the like of each ceramic electronic part by a so-called transmission type image recognition method and can also use an attracting nozzle B having a narrow front end portion. In this case, a large gap G is created between the bottom surface 23b of the ceramic device 21 and a packaged substrate or a table against which the ceramic device 21 rests. When the attracting nozzle B is pressed against the ceramic electronic part 25 to attract it, the ceramic device 21 may be greatly distorted, resulting in a crack 27. In some cases, the ceramic device 21 may break.

SUMMARY OF THE INVENTION

The present invention is able to solve the foregoing problems. It is an advantage of the invention to provide a highly reliable ceramic electronic part that can be reliably attracted by a vacuum attraction type attracting nozzle without inducing cracks or breaks.

The above object may be achieved by a ceramic electronic part which comprises a ceramic device or body having a length of L, a height of H, and a width of W, and may be characterized in that $L \leq 1.0$ mm, $H \leq 0.5$ mm, and $W \leq 0.5$ mm. Each external electrode has rounded portions extending from one end surface of the ceramic body to its adjacent side surfaces. Let t be the thickness of these rounded portions. This electronic part may be further characterized in that $t \leq 10\ \mu m$ and $t \leq H/30$.

Thus, in the small-sized ceramic electronic part having the dimensions described above, the thickness t of the rounded portions of the external electrodes extending from the end surfaces to the adjacent outer surfaces is set less than 10 $\mu m$ and set less than 1/30 of the height (H) of the ceramic device. This prevents a large step at the interface between the portions of the top surface of the ceramic device where the external electrode is formed and not formed, respectively. Accordingly, the reliability of attraction relying on vacuum attraction can be enhanced.

The thickness of the rounded portions of the external electrodes extending from the end surfaces to their adjacent outer surfaces is set within the above-described range. This can prevent any large gap between the bottom surface of the ceramic device and the packaged substrate or table. Therefore, when the attracting nozzle is pushed against the ceramic device, it is prevented from being distorted greatly. Consequently, the device is kept from cracking or breaking.

The ceramic electronic part in accordance with the present invention may be further characterized in that the thickness t of the rounded portions of the external electrodes extending from the end surfaces to their adjacent outer surfaces satisfies the relation $$t \leq W/30$$

Where the thickness t of the rounded portions of the external electrodes of the above-described ceramic electronic part extending from the end surfaces to their adjacent outer surfaces is set less than 1/30 of the width W of the ceramic device in this way, any outer surface of the ceramic device can be made to face downward. That is, directionality can be removed from the ceramic electronic part. This can enhance the reliability of attraction and prevent cracking. Where a chip-mount machine treats ceramic devices in bulk form, mechanical impacts are applied from various directions to the devices. In this case, however, ceramic device cracking and external electrode delamination can be prevented.

Other objects and features of the invention will appear in the course of the description of an embodiment thereof, which follows.

DETAILED DESCRIPTION OF AN EMBODIMENT OF THE INVENTION

An embodiment of the present invention and its features will be hereinafter described in further detail. A surface-mounted laminated ceramic capacitor is taken as an example of the invention.

Figure 1:
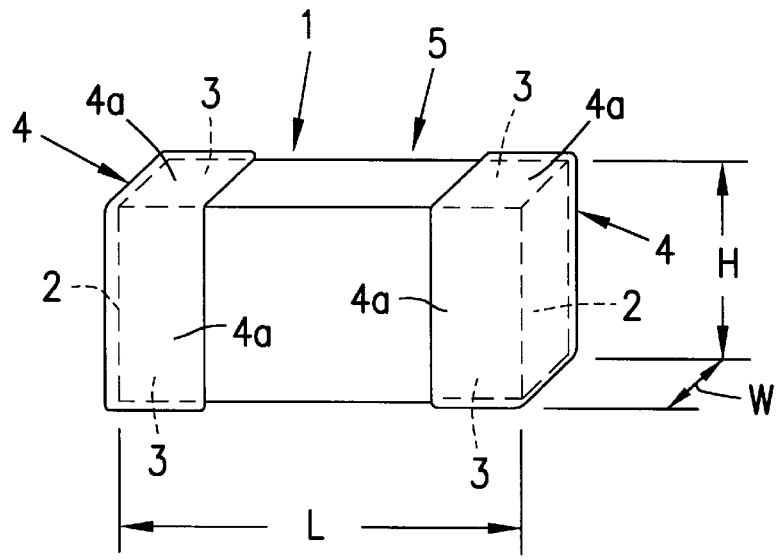
FIG. 1 is a perspective view of a laminated ceramic capacitor, or a ceramic electronic part, in accordance with the present invention.
Figure 2:
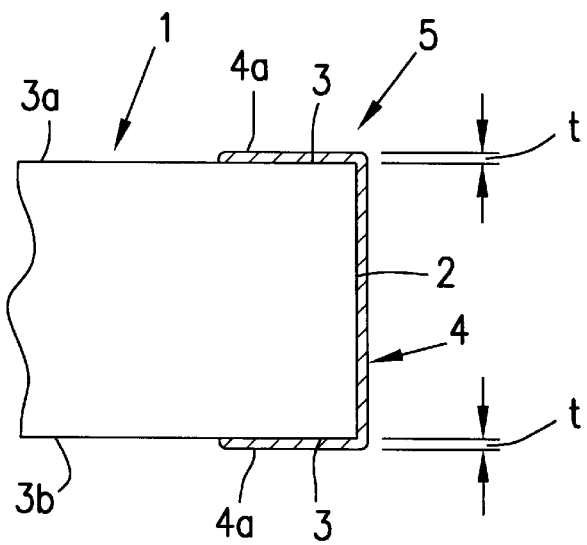
FIG. 2 is a view showing a main portion of the laminated ceramic capacitor shown in FIG. 1.

FIG. 1 is a perspective view of a laminated ceramic capacitor, or a ceramic electronic part, forming one embodiment of the invention. FIG. 2 is a view showing a main portion of the laminated ceramic capacitor.

In this embodiment, the laminated ceramic capacitor, indicated by numeral 5, comprises a boxlike ceramic device 1, as shown in FIGS. 1 and 2, in which electrodes (not shown) are disposed to form a capacitance. External electrodes 4 are formed around opposite end surfaces 2 of the ceramic device 1 and extend from their respective end surfaces 2 to side surfaces 3 contiguous to the end surfaces.

The various portions of the ceramic device 1 forming the laminated ceramic capacitor 5 have the following dimensions:

length (L)=0.6 mm
height (H)=0.3 mm
width (W)=0.3 mm

In this laminated ceramic capacitor 5, the external electrodes 4 have rounded portions 4a extending from the end surfaces 2 of the ceramic device 1 to their adjacent side surfaces 3. These rounded portions 4a have a thickness t of 2 to 5 μm, which is about 1/200 to 1/50 of the height (H) and width (W) of the ceramic device 1.

Examples of methods of adjusting the thickness t of the rounded portions of the external electrodes 4 include:

(1) adjusting the specific gravity and viscosity of a conductive paste for forming the electrodes; and (2) adjusting the immersion rate or immersion time when the ceramic device is immersed in the conductive paste.

It is to be noted that the permissible adjusting methods are not limited to these examples. Other methods may also be utilized.

Figure 3:
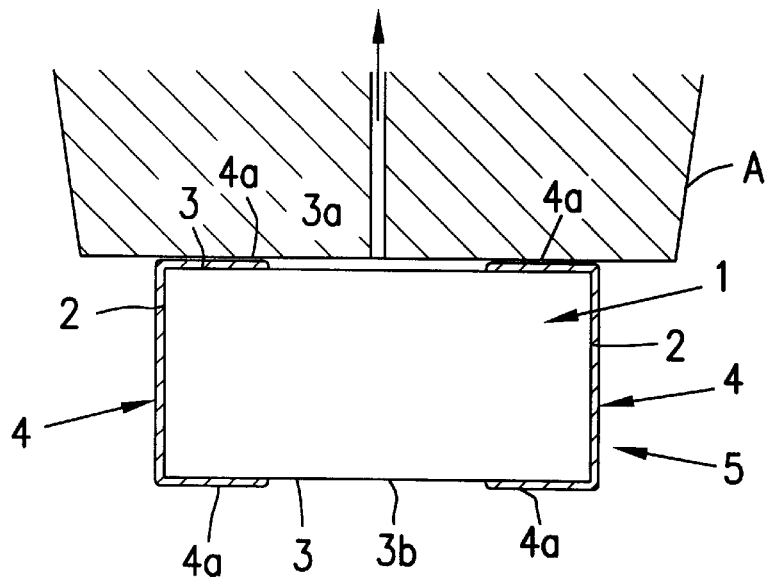
FIG. 3 is a vertical cross-section of the ceramic capacitor shown in FIG. 1, and in which the capacitor is being attracted by an attracting nozzle.

In the above-described laminated ceramic capacitor 5, the external electrodes 4 have the rounded portions 4a extending from the end surfaces 2 of the ceramic device 1 to their adjacent outer surfaces 3, and these rounded portions 4a have a thickness t of 2 to 5 μm, i.e., about 1/200 to 1/50 of the height (H) and width (W) of the ceramic device 1, as shown in FIGS. 1 and 2. Therefore, no large steps are formed at the interface between the portions of the top surface (or, attracted surface) 3a of the ceramic device 1 on which each external electrode 4 is formed and not formed, respectively. As a result, where the laminated ceramic capacitor 5 is attracted by the attracting nozzle A having a wide front end portion as shown in FIG. 3, it is assured that the capacitor is attracted, the nozzle A being used by an automatic packaging machine that detects the position or the like of each ceramic electronic part by a so-called reflection type image recognition method.

Figure 4:
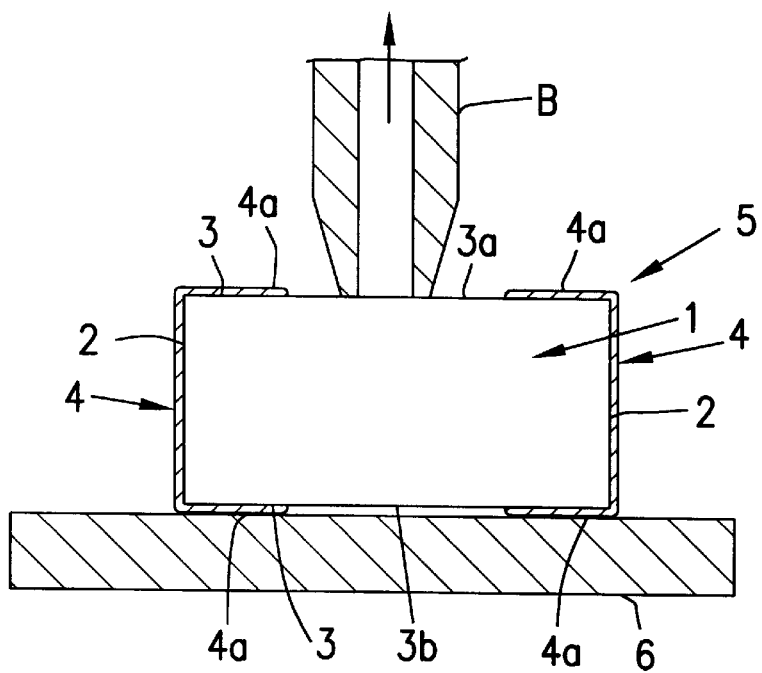
FIG. 4 is a vertical cross-section similar to FIG. 3, but in which the capacitor is being attracted by another attracting nozzle.
Figure 5:
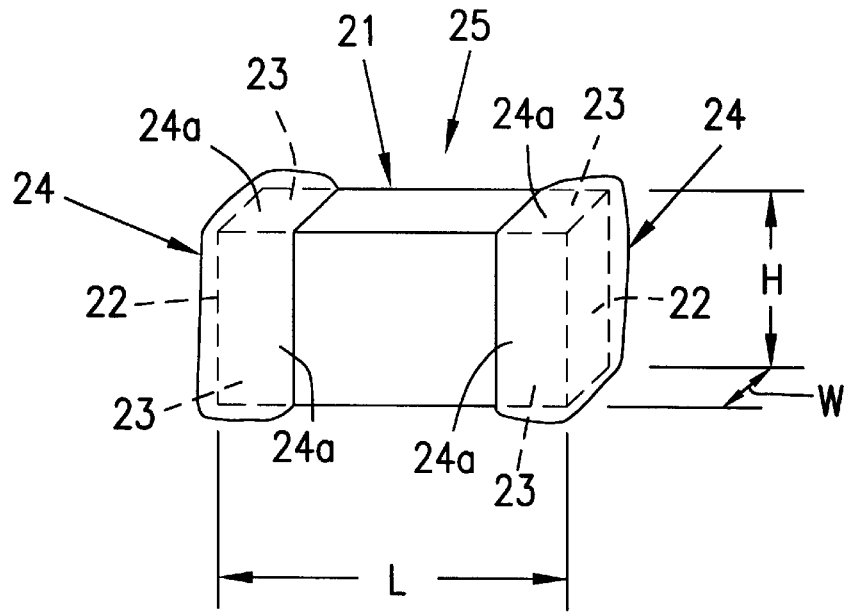
FIG. 5 is a perspective view of a prior art ceramic electronic part.
Figure 6:
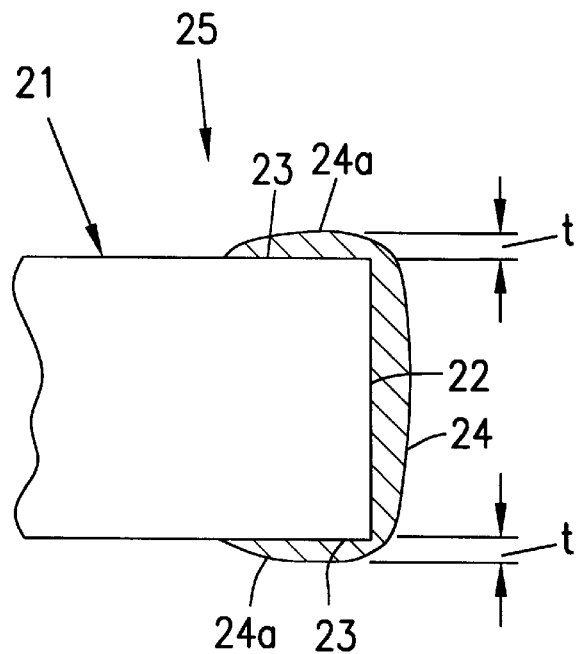
FIG. 6 is a view of a main portion of the prior art ceramic electronic part shown in FIG. 5.
Figure 7:
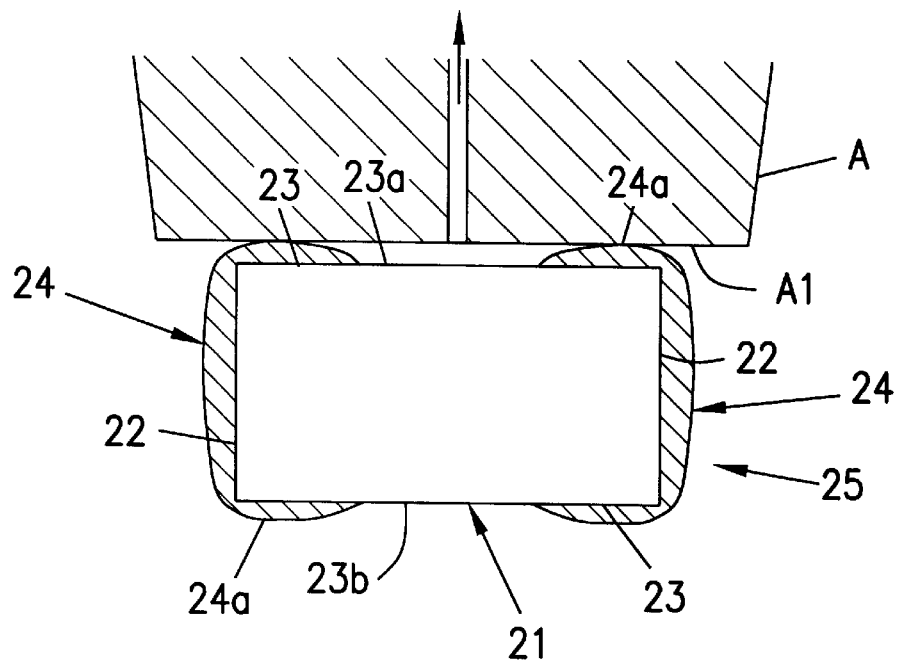
FIG. 7 is a vertical cross-section of the prior art ceramic capacitor shown in FIG. 6, and in which the capacitor is being attracted by an attracting nozzle.
Figure 8:
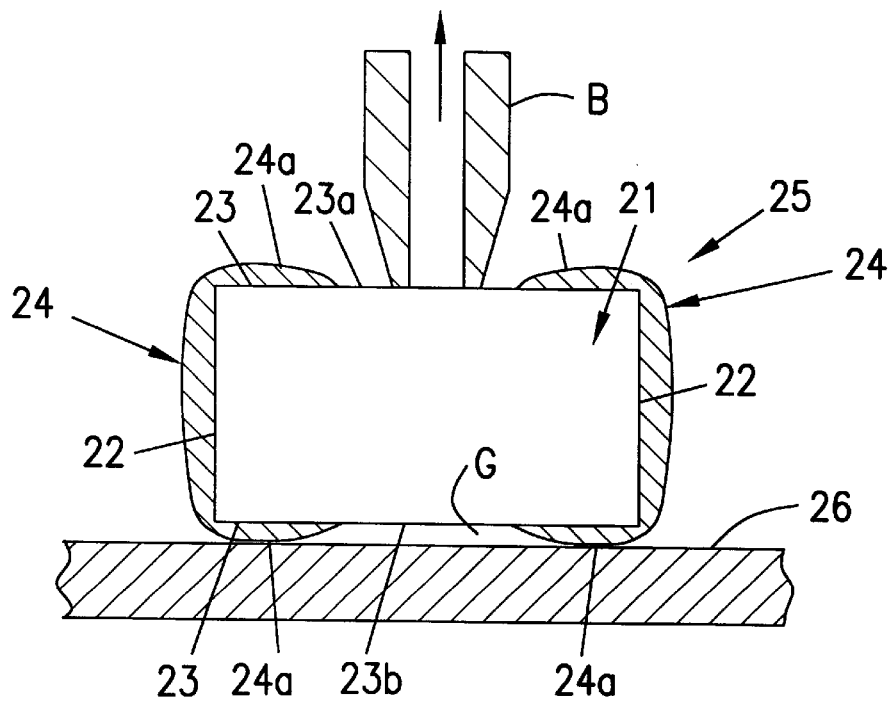
FIG. 8 is a vertical cross-section similar to FIG. 7, but in which the capacitor is being attracted by another attracting nozzle.

Since the thickness t of the rounded portions of the external electrodes 4 of the ceramic device 1 extending from the end surfaces 2 to their adjacent side surfaces 3 is set to 2 to 5 μm, i.e., about 1/200 to 1/50 of the height (H) and width (W) of the ceramic device 1, a small gap is created between the bottom surface 3b of the ceramic device 1 and a packaged substrate 6, a table, or the like. Accordingly, where the device is attracted with an attracting nozzle B having a narrow front end portion and used by an automatic packaging machine that detects the position or the like of each ceramic electronic part by a so-called transmission type image recognition method, as shown in FIG. 4, the ceramic device 1 can be prevented from cracking or breaking when the attracting nozzle B is pressed against the laminated ceramic capacitor 5 and attracted.

In a packaging step, if a chip-mount machine treats bulk devices, mechanical impacts are applied from various directions to the bulk devices. However, ceramic device cracking and delamination of the external electrodes 4 can be prevented, because the rounded portions 4a of the external electrodes 4 extending to the side surfaces of the ceramic device 1 have a small thickness and thus protrude only slightly from the outer surfaces of the ceramic device 1.

For laminated ceramic capacitors in accordance with the present invention and for comparative examples of laminated ceramic capacitors, the relations between the thicknesses of the rounded portions of the external electrodes extending to the side surfaces of the ceramic device, the rate of occurrence of defective attraction, the rate of occurrence of cracks, and the rate of occurrence of cracking due to mechanical impacts have been examined. The relations obtained are given in Table 1. The rates of occurrence of defective attraction given in Table 1 were obtained with the samples being attracted by the above-described attracting nozzle A (FIG. 3). The rates of occurrence of cracks given in Table 1 were obtained with the samples being attracted by the above-described attracting nozzle B (FIG. 4). The rates of occurrence of cracking due to mechanical impacts were obtained with samples in bulk form being treated by a chip-mount machine.

TABLE 1

| Sample Number | Dimensions of Ceramic Device (L) × (H) × (W) (mm) | Thickness (t) of Rounded Portions of External Electrodes (μm) | t / H | Rate of Occurrence of Defective Attraction Where Nozzle A is Used (%) | Rate of Occurrence of Cracks Where Nozzle B is Used (%) | Rate of Occurrence of Cracking Where Chip-Mount Machine is Used (%) |
|---|---|---|---|---|---|---|
| 1 | 0.6 × 0.3 × 0.3 | 7 | 1/43 | 0 | 0 | 0 |
| 2 | 0.6 × 0.3 × 0.3 | 10 | 1/30 | 0 | 0 | 0 |
| *3 | 0.6 × 0.3 × 0.3 | 14 | 1/21 | 0 | 2 | 5 |
| 4 | 1.0 × 0.5 × 0.5 | 7 | 1/43 | 0 | 0 | 0 |
| 5 | 1.0 × 0.5 × 0.5 | 10 | 1/30 | 0 | 0 | 0 |
| *6 | 1.0 × 0.5 × 0.5 | 15 | 1/20 | 0 | 1 | 1 |
| *7 | 1.0 × 0.5 × 0.5 | 20 | 1/15 | 1 | 2 | 3 |
| *8 | 1.6 × 0.8 × 0.8 | 7 | 1/43 | 0 | 0 | 0 |
| *9 | 1.6 × 0.8 × 0.8 | 10 | 1/30 | 0 | 0 | 0 |
| *10 | 1.6 × 0.8 × 0.8 | 15 | 1/20 | 0 | 0 | 0 |
| *11 | 1.6 × 0.8 × 0.8 | 20 | 1/15 | 0 | 0 | 0 |

*Samples which deviate from the scope of the invention.

It can be seen from Table 1 that for laminated ceramic capacitors having sample numbers 8, 9, 10, and 11 and having dimensions exceeding the range of the present invention, even if the thickness of the rounded portions of the external electrodes is 1/15 of the height (H) of the ceramic device (sample number 11), none of the defective attraction, cracks, and breaking due to mechanical impacts from the chip-mount machine are observed. However, for the laminated ceramic capacitors of the comparative examples (having sample numbers 3, 6, and 7) whose external electrodes have thicknesses not satisfying the requirements of the present invention, as the dimensions of the ceramic device decrease, it is observed that defective attraction, cracks, and breaking due to mechanical impacts by the chip-mount machine take place. On the other hand, for the samples (having sample numbers 1, 2, 4, and 5) of the embodiments of the invention which meet the requirements of the invention, i.e., the thickness of the rounded portions of the external electrodes of the ceramic device extending to the side surfaces is less than 10 μm and less than 1/30 of the height (H) of the ceramic device, none of the defective attraction, cracks, and breaks due to mechanical impacts by the chip-mount machine are observed.

In the above embodiment, a laminated ceramic capacitor is taken as an example. It is to be understood that the present invention is not limited to laminated ceramic capacitors. Rather, the invention can be applied to various ceramic electronic parts comprising a ceramic device having external electrodes around its opposite end surfaces. In this case, the same advantages can be obtained as in the above-described embodiment.

Furthermore, the invention is not limited to the above embodiment in other respects. Various changes and modifications can be made to the specific dimensions, shapes, the pattern of the external electrodes, and so on of the ceramic device within the scope of the invention.

As described above, in a ceramic electronic part in accordance with the invention, the thickness t of the rounded portions of each external electrode that extend from end surfaces to the adjacent side surfaces is set less than 10 μm and less than 1/30 of the height (H) of the ceramic device. Therefore, if the ceramic electronic part is small in size (e.g., satisfying the conditions: length (L)≦1.0 mm, height (H)≦0.5 mm, and width (W)≦0.5 mm), no large step is created at the interface between the portions of the top side surface of the ceramic device on which the external electrode is formed and against which an attracting nozzle comes into contact and the portion on which no external electrode is formed. This can enhance the reliability of attraction relying on vacuum attraction.

Formation of any gap between the bottom side surface of the ceramic device and the packaged substrate or a table is prevented by setting the thickness of the rounded portions of the ceramic device extending from the end surfaces to the adjacent outer surfaces within the above-described range. When the attracting nozzle is pressed against the ceramic device, it is prevented from cracking or breaking.

Where, in addition, the thickness t of the rounded portions of the external electrodes of the above-described ceramic electronic part extending from the end surfaces to their adjacent outer surfaces is set to less than 1/30 of the width W of the ceramic device, any outer surface of the ceramic device can be made to face downward. With the ceramic electronic device constructed in this way (i.e., whose directionality has been removed), the reliability of attraction can be improved, and cracking and breaks can be prevented. In this case, if a chip-mount machine treats bulk devices, mechanical impacts are applied from various directions to the bulk devices. However, ceramic device cracking and external electrode delamination can be prevented. Hence, the productivity can be improved.

What is claimed is:

1. A ceramic electronic part comprising a ceramic device having a length (L)≦1.0 mm, a height (H) ≦0.5 mm, and a width (W)≦0.5 mm, said ceramic device having two end surfaces spaced from each other along its longitudinal direction and side surfaces located between the end surfaces, said ceramic electronic part further having external electrodes formed around said end surfaces, said external electrodes having rounded portions extending from the end surfaces of said ceramic device to their adjacent side surfaces, said rounded portions having a thickness of t that satisfies relationships $t \leq 10\ \mu m$ and $t \leq H/30.$ 2. The ceramic electronic part of claim 1, wherein the thickness t of said rounded portions extending from the end surfaces of said ceramic device to their adjacent side surfaces further satisfies a relationship given by $t \leq W/30.$

* * * * *